US009843779B2

(12) United States Patent
Giusti et al.

(10) Patent No.: US 9,843,779 B2
(45) Date of Patent: Dec. 12, 2017

(54) RESONANT BIAXIAL MEMS REFLECTOR WITH PIEZOELECTRIC ACTUATORS, AND PROJECTIVE MEMS SYSTEM INCLUDING THE SAME

(71) Applicant: STMicroelectronics S.r.l., Agrate Brianza (IT)

(72) Inventors: Domenico Giusti, Monza (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/162,367

(22) Filed: May 23, 2016

(65) Prior Publication Data
US 2017/0155879 A1    Jun. 1, 2017

(30) Foreign Application Priority Data

Nov. 30, 2015    (IT) .................. 102015000078398

(51) Int. Cl.
| | | |
|---|---|---|
| *G02B 26/08* | (2006.01) | |
| *H04N 9/31* | (2006.01) | |
| *G02B 26/10* | (2006.01) | |
| *G02B 7/182* | (2006.01) | |

(52) U.S. Cl.
CPC ......... *H04N 9/3135* (2013.01); *G02B 7/1821* (2013.01); *G02B 26/0858* (2013.01); *G02B 26/101* (2013.01); *H04N 9/3173* (2013.01)

(58) Field of Classification Search
CPC .............. G02B 26/10; G02B 26/0833; G02B 26/0841; G02B 7/1821; G02B 26/0858; G02B 26/101; H04N 9/3135; H04N 9/3173; B81B 3/00

USPC ....................................... 359/200.8
See application file for complete search history.

(56) References Cited

U.S. PATENT DOCUMENTS

| | | |
|---|---|---|
| 6,943,484 B2 | 9/2005 | Clark et al. |
| 2005/0094931 A1 | 5/2005 | Yokoyama et al. |
| 2012/0120470 A1 | 5/2012 | Kitazawa et al. |
| 2013/0208330 A1 | 8/2013 | Naono |
| 2013/0328440 A1 | 12/2013 | Kornbluh et al. |

(Continued)

OTHER PUBLICATIONS

IT Search Report and Written Opinion for IT 102015000078398 dated Jul. 20, 2016 (10 pages).

(Continued)

*Primary Examiner* — Euncha Cherry
(74) *Attorney, Agent, or Firm* — Gardere Wynne Sewell LLP

(57) ABSTRACT

A MEMS device includes a fixed structure and a mobile structure with a reflecting element coupled to the fixed structure through at least a first deformable structure and a second deformable structure. Each of the first and second deformable structures includes a respective number of main piezoelectric elements, with the main piezoelectric elements of the first and second deformable structures configured to be electrically controlled for causing oscillations of the mobile structure about a first axis and a second axis, respectively. The first deformable structure further includes a respective number of secondary piezoelectric elements configured to be controlled so as to vary a first resonance frequency of the mobile structure about the first axis.

27 Claims, 9 Drawing Sheets

(56) References Cited

U.S. PATENT DOCUMENTS

2014/0320943 A1* 10/2014 Oyama .............. G02B 26/0858
359/198.1

OTHER PUBLICATIONS

Hofmann, Ulrich et al., "Wafer Level Vacuum Packaged Two-Axis MEMS Scanning Mirror for Pico Projector Application," MOEMS and Miniaturized Systems XIII, Proc.of SPIE, vol. 8977, 2014 (14 pages).

* cited by examiner

RESONANT BIAXIAL MEMS REFLECTOR WITH PIEZOELECTRIC ACTUATORS, AND PROJECTIVE MEMS SYSTEM INCLUDING THE SAME

PRIORITY CLAIM

This application claims priority from Italian Application for Patent No. 102015000078398 filed Nov. 30, 2015, the disclosure of which is incorporated by reference.

TECHNICAL FIELD

The present invention relates to a reflector of the MEMS (Micro-Electro-Mechanical Systems) type. In particular, the present invention relates to a resonant biaxial MEMS reflector, which includes piezoelectric actuators. Moreover, the present invention relates to a MEMS projective system including the resonant biaxial MEMS reflector.

BACKGROUND

As is known, numerous MEMS devices are today available. In particular, so-called MEMS reflectors are known, which include mobile elements formed by mirrors.

In general, a MEMS reflector is designed to receive an optical beam and to vary the direction of propagation thereof, via a mirror. Typically, the direction of propagation of the optical beam is varied in a periodic or quasi-periodic way so as to carry out a scan of a portion of space with the reflected optical beam.

In greater detail, MEMS reflectors of a resonant type are moreover known. In general, a resonant MEMS reflector comprises an actuation system that causes oscillation of the respective mirror in a substantially periodic way about a resting position, the period of oscillation being as close as possible to the resonance frequency of the mirror in order to maximize the angular distance covered by the mirror during each oscillation, and hence maximize the size of the portion of space scanned.

Among resonant MEMS reflectors, so-called biaxial MEMS reflectors are moreover known, where the mirror oscillates about two different axes, perpendicular to one another, with frequencies approximately equal to the respective resonance frequencies of the mirror with respect to the aforesaid axes.

In the context of generation of images using resonant biaxial MEMS reflectors, it is known to adopt markedly different resonance frequencies for the two scanning axes. For example, resonant biaxial MEMS reflectors are known having their two resonance frequencies equal, for example, to 18 kHz and 600 Hz. Moreover, irrespective of the specific values of the resonance frequencies, when an image is formed using a resonant biaxial MEMS reflector, the latter directs the reflected optical beam in such a way that it follows a so-called Lissajous trajectory. Consequently, the full image is obtained as set of interlaced complementary images.

This having been said, the use of resonant biaxial MEMS reflectors entails generation of images affected by so-called flicker. To overcome this drawback, the so-called image-refresh rate is increased up to values much higher than sixty frames per second. Since, according to another point of view, the flicker phenomenon can be interpreted as an imperfect coverage of each frame, the increase in the refresh rate renders this phenomenon less perceptible to the human eye.

In order to reduce the flicker phenomenon, the paper Hofmann et al., "Wafer level vacuum packaged two-axis MEMS scanning mirror for pico projector application", Proceedings of SPIE, Vol. 8977 89770A-11 (incorporated by reference), suggests adoption of a biaxial structure with high resonance frequencies, which ideally differ by 60 Hz. In practice, the aforementioned paper proposes a resonant biaxial MEMS reflector with an actuation system of an electrostatic type, where both of the resonance frequencies are relatively high (one is 14.9 kHz and the other is 15.6 kHz), the difference between them being 700 Hz. This enables reduction of the refresh rate to values of less than sixty frames per second, without the flicker phenomenon excessively damaging the quality of the images. However, unfortunately there are not known solutions that enable precise control of the difference between the two resonance frequencies, even for particularly low values of this difference and in the case of operating bands that reach high frequencies (for example, between 20 kHz and 30 kHz). In this connection, it should be noted how in theory the adoption of high resonance frequencies close to one another enables, given the same refresh rate, a higher resolution to be obtained, as well as a better coverage of the images.

There is a need in the art to provide a MEMS device that will solve at least in part the drawbacks of the known art.

SUMMARY

In an embodiment, a MEMS device comprises: a fixed structure; a mobile structure including a reflecting element a first deformable structure arranged between the fixed structure and the mobile structure; and a second deformable structure arranged between the fixed structure and the mobile structure. Each of the first and second deformable structures comprises a respective number of main piezoelectric elements. The main piezoelectric elements of the first deformable structure are configured to be electrically controlled for causing a first substantially periodic deformation of the first deformable structure and a consequent oscillation of the mobile structure about a first axis. The main piezoelectric elements of the second deformable structure are configured to be electrically controlled for causing a second substantially periodic deformation of the second deformable structure and a consequent oscillation of the mobile structure about a second axis. The first deformable structure comprises a respective number of secondary piezoelectric elements configured to be electrically controlled for causing a second deformation of the first deformable structure and vary a first resonance frequency of the mobile structure about said first axis.

In an embodiment, the foregoing MEMS device is included in a MEMS projector system.

In an embodiment, a MEMS device comprises: a fixed structure; a mobile structure with a reflecting element coupled to the fixed structure through at least a first deformable structure and a second deformable structure; a respective number of main piezoelectric elements mounted to each of the first and second deformable structures, said main piezoelectric elements configured to be electrically controlled for causing oscillations of the mobile structure about a first axis and a second axis, respectively; and a respective number of secondary piezoelectric elements mounted to the first deformable structure, said secondary piezoelectric elements mounted to the first deformable structure configured to be controlled so as to vary a first resonance frequency of the mobile structure about the first axis.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 1:
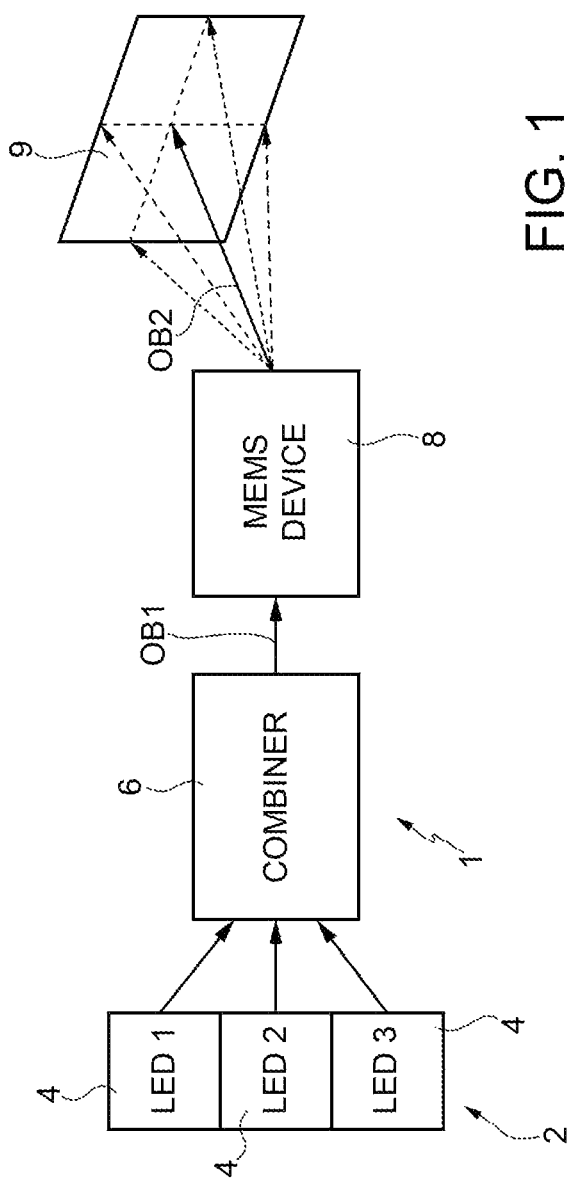
FIG. 1 shows a block diagram of a projective system including a MEMS reflector.

FIG. 1 shows a MEMS projective system 1, which includes a light source 2 formed by a plurality of LEDs 4, each of which emits electromagnetic radiation at a corresponding wavelength. For example FIG. 1 shows three LEDs 4, which emit radiation, respectively, around the red (620-750 nm) wavelength, the green (495-570 nm) wavelength, and the blue (450-475 nm) wavelength.

The MEMS projective system 1 further comprises an optical combiner 6 and a MEMS reflector 8. Moreover, FIG. 1 shows also a screen 9. The MEMS projective system 1 forms a so-called pico-projector.

The optical combiner 6 is arranged downstream of the light source 2 so as to receive the electromagnetic radiation emitted by the LEDs 4 and form a single optical beam OB1, obtained from the combination of said electromagnetic radiation. For this purpose, the optical combiner 6 may, for example, include one or more dichroic elements. Moreover, the optical combiner 6 is designed to direct the optical beam OB1 onto the MEMS reflector 8. In turn, the MEMS reflector 8, described in greater detail hereinafter, is designed to reflect the optical beam OB1, thus generating a reflected optical beam OB2, and to send the reflected optical beam OB2 onto the screen 9 for bringing about formation of images on the screen 9.

In detail, the MEMS reflector 8 is designed to vary in time the orientation in space of the axis of the reflected optical beam OB2 so as to scan in a substantially periodic way portions of the screen 9. As described in greater detail hereinafter, the MEMS reflector 8 is of a biaxial type, with axes orthogonal to one another.

Figure 2:
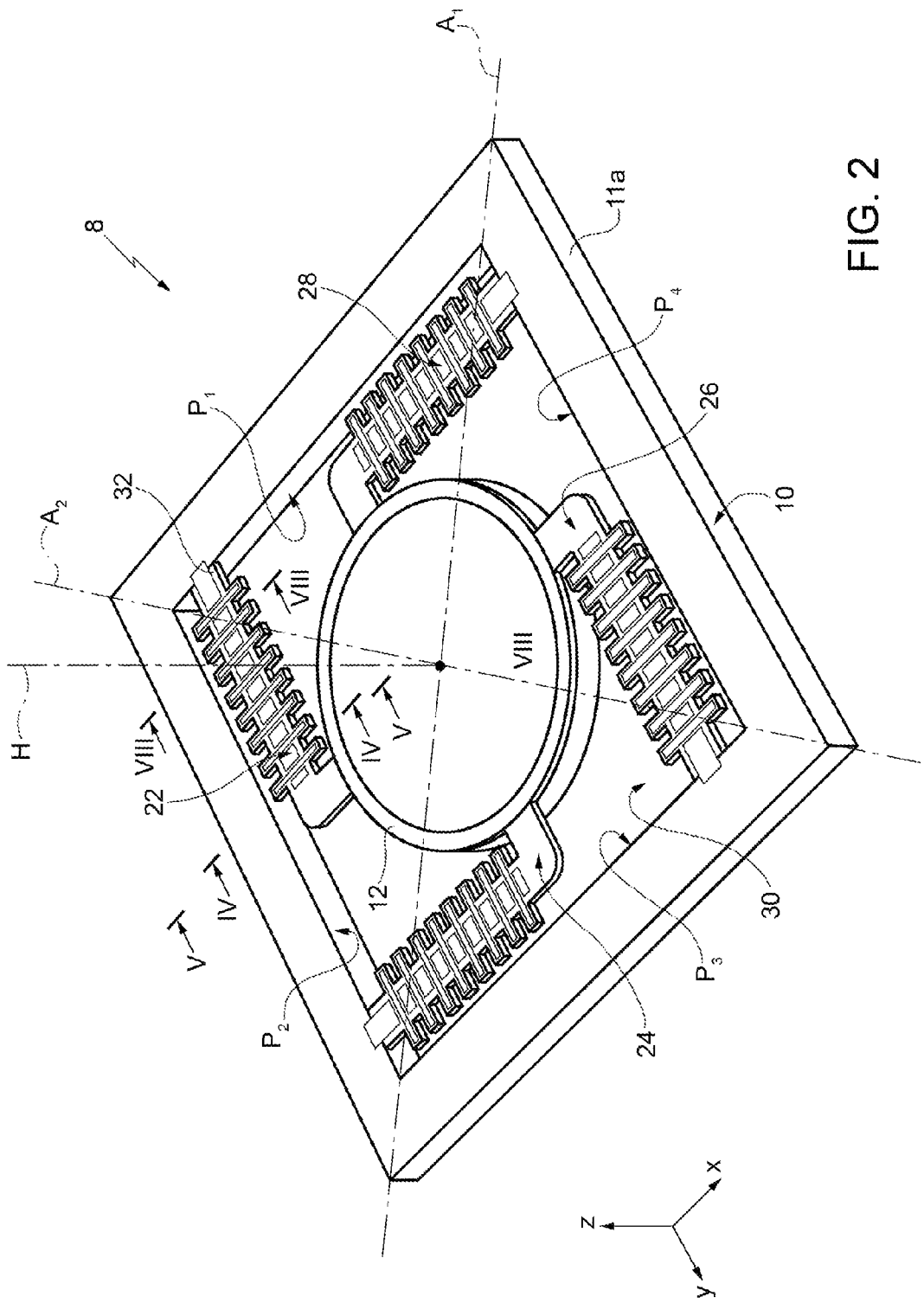
FIG. 2 is a schematic perspective view with portions removed of the MEMS reflector.

As shown in FIG. 2, the MEMS reflector 8 comprises a structure 10, which will be referred to in what follows as the fixed structure 10, as well as a mobile structure 12, and four structures, which will be referred to in what follows as the first connection structure 22, the second connection structure 24, the third connection structure 26, and the fourth connection structure 28.

In greater detail, the fixed structure 10 comprises a respective bottom portion 11a. The bottom portion 11a of the fixed structure 10 has the shape of a parallelepiped with square base, extending inside which is a cavity 30 of a through type, which to a first approximation also has the shape of a parallelepiped with square base. The cavity 30 is then delimited laterally by a first side wall $P_1$, a second side wall $P_2$, a third side wall $P_3$, and a fourth side wall $P_4$. Moreover, the first and third side walls $P_1$, $P_3$ are opposite to one another and are parallel to an axis x of an orthogonal reference system xyz, whereas the second and fourth side walls $P_2$, $P_4$ are opposite to one another and parallel to the axis y of the reference system xyz.

Without any loss of generality, the first, second, third, and fourth connection structures 22, 24, 26, 28 are the same as one another. For this reason, in what follows, the description is limited to the first connection structure 22, it being understood that the second, third, and fourth connection structures 24, 26, 28 are the same as the first connection structure 22, except where otherwise specified.

Figure 3:
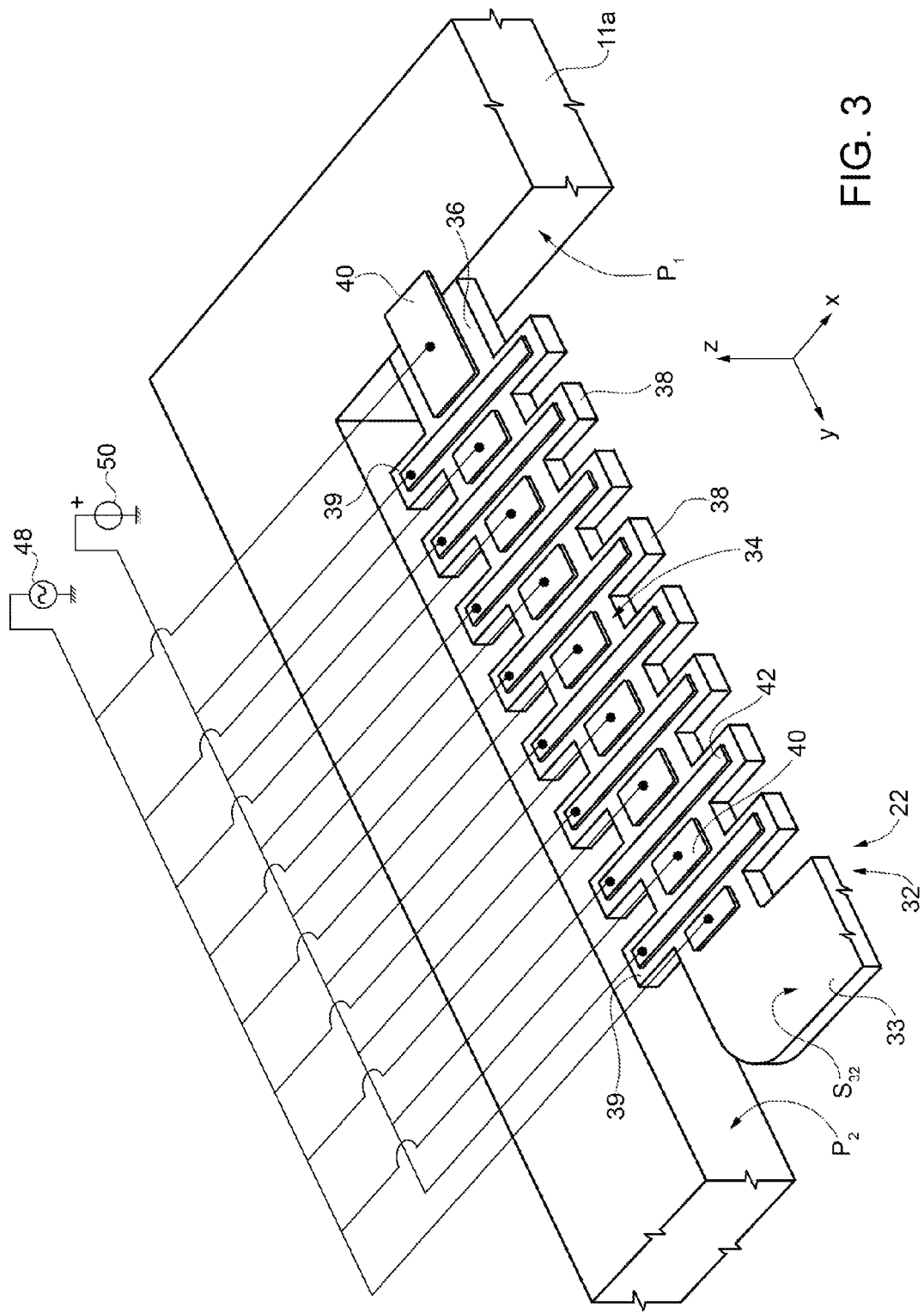
FIG. 3 shows an enlargement of a portion of FIG. 2.

The first connection structure 22 is elastically deformable. In addition, as shown in FIG. 3, the first connection structure 22 comprises a supporting structure 32, which is described hereinafter, on the hypothesis that the first connection structure 22 is in resting conditions, except where otherwise specified.

In detail, the supporting structure 32 extends in the cavity 30 and comprises a first portion 33 and a second portion 34.

In greater detail, the first portion 33 of the supporting structure 32 has an elongated shape parallel to the axis x. The second portion 34 of the supporting structure 32 forms a main body 36, a plurality of transverse elements of a first type, designated by 38, and a plurality of transverse elements of a second type, designated by 39. The main body 36 has an elongated shape and extends parallel to the axis y. Moreover, the main body 36 is connected to the first portion 33 of the supporting structure 32 so as to form approximately an L shape. More in particular, the first portion 33 of the supporting structure 32 and the main body 36 of the second portion 34 of the supporting structure 32 form, respectively, the short arm and the long arm of the L shape defined by the supporting structure 32. In addition, a first end of the supporting structure 32, defined by the first portion 33, is fixed to the mobile structure 12, and a second end of the supporting structure 32, defined by the main body 36, is fixed to the first side wall $P_1$.

As regards the transverse elements 38 of the first type and the transverse elements 39 of the second type, they have an elongated shape directed parallel to the axis x. In other words, the transverse elements are elongated in a direction perpendicular to the direction of extension of the main body 36.

If the transverse elements 38 of the first type and the transverse elements 39 of the second type are referred to, respectively, as the inner transverse elements 38 and outer transverse elements 39, to each inner transverse element 38 there corresponds a respective outer transverse element 39. Furthermore, the outer transverse elements 39 extend from the main body 36 towards the bottom portion 11a of the fixed structure 10, and in particular towards the second side wall $P_2$; the inner transverse elements 38 extend from the main body 36 towards the mobile structure 12, i.e., towards the fourth side wall $P_4$. More in particular, each inner transverse element 38 is aligned (parallel to the axis x) to the corresponding outer transverse element 39. These transverse elements extend on opposite sides with respect to the main body 36. Purely by way of example, in the embodiment shown in FIG. 3, eight pairs of transverse elements are present.

The first and second portions 33, 34 of the supporting structure 32 are delimited at the top by a top surface $S_{32}$. The top surface $S_{32}$ hence delimits the main body 36, the inner transverse elements 38, and the outer transverse elements 39.

The first connection structure 22 further comprises a plurality of piezoelectric regions 40, which will be referred to in what follows as the main piezoelectric regions 40.

In detail, the main piezoelectric regions 40 are made, for example, of lead zirconate titanate (PZT) and extend on the top surface $S_{32}$. In particular, the main piezoelectric regions 40 are arranged in succession in a direction parallel to the axis y, in contact with the main body 36; i.e., they are arranged one after another in the longitudinal direction of the main body 36, at a distance from one another.

In greater detail, and without any loss of generality, each main piezoelectric region 40 may have, for example, the shape of a parallelepiped with a height (measured along the axis z) smaller than the length and the width, either the length or the width being parallel to the axis x.

The first connection structure 22 further comprises a plurality of additional piezoelectric regions 42, which will be referred to in what follows as the secondary piezoelectric regions 42.

The secondary piezoelectric regions 42 are made, for example, of lead zirconate titanate. In addition, without any loss of generality, each secondary piezoelectric region 42 has an elongated shape, in a direction parallel to the axis x. For example, each secondary piezoelectric region 42 may have the shape of a parallelepiped with a height smaller than the length (parallel to the axis x) and than the width.

In greater detail, the secondary piezoelectric regions 42 extend on the top surface $S_{32}$. In particular, the secondary piezoelectric regions 42 are arranged in succession in a direction parallel to the axis y, in contact with the main body 36. More in particular, each secondary piezoelectric region 42 extends in contact with a corresponding pair formed by an inner transverse element 38 and by the corresponding outer transverse element 39, as well as in contact with the portion of the main body 36 from which this inner transverse element 38 and this corresponding outer transverse element 39 extend. Each secondary piezoelectric region 42 hence has an elongated shape in a direction parallel to the axis x.

Once again with reference to the main piezoelectric regions 40, each of them extends on a corresponding portion of the main body 36. Moreover, the portions of main body 36 on which corresponding main piezoelectric regions 40 extend are interspersed with the portions of main body 36 on which the secondary piezoelectric regions 42 extend. Consequently, in a direction parallel to the axis y, the main piezoelectric regions 40 and the secondary piezoelectric regions 42 are interspersed with one another.

For reasons described hereinafter, in use the main piezoelectric regions 40 are electrically connected to a first a.c. generator 48, which is designed to generate an a.c. voltage. In particular, the main piezoelectric regions 40 are connected to one and the same first terminal of the first a.c. generator 48, the second terminal of which is set, for example, to ground. The secondary piezoelectric regions 42 are, instead, electrically connected to one and the same first terminal of a first d.c. generator 50, the second terminal of which is connected, for example, to ground. The first d.c. generator 50 is designed to generate a d.c. voltage, which can be varied in a controlled way. In FIG. 3, the electrical connections between the main/secondary piezoelectric regions 40/42 and the first a.c./d.c. generator 48/50 are represented qualitatively.

Once again with reference to the aforementioned bottom portion 11a of the fixed structure 10, it comprises a semiconductor region 60 (shown in FIG. 4), which is made, for example, of silicon and which will be referred to in what follows as the fixed semiconductor region 60.

The bottom portion 11a of the fixed structure 10 further comprises a conductive region 62 and a first insulating region 64 and a second insulating region 66, which will be referred to in what follows, respectively, as the fixed conductive region 62 and the first and second fixed insulating regions 64, 66.

The first fixed insulating region 64 is made, for example, of thermal oxide and extends over the fixed semiconductor region 60, with which it is in direct contact. The fixed conductive region 62 is made, for example, of polysilicon and extends over the first fixed insulating region 64, with which it is in direct contact. The second fixed insulating region 66 is made, for example, of TEOS oxide and extends over the fixed conductive region 62, with which it is in direct contact.

The bottom portion 11a of the fixed structure 10 further comprises an electrode region 68, which will be referred to in what follows as the fixed electrode region 68. In detail, the fixed electrode region 68 is made, for example, of a metal (for example, ruthenium) and extends over the second fixed insulating region 66, with which it is in direct contact.

As regards the supporting structure 32 of the first connection structure 22, it comprises a respective semiconductor region 70, which is made, for example, of silicon and which will be referred to in what follows as the deformable semiconductor region 70.

In resting conditions, the deformable semiconductor region 70 is delimited at the top by a surface $S_{70}$ of a planar type, which will be referred to in what follows as the first intermediate surface $S_{70}$. Moreover, if the surface that delimits at the top the fixed semiconductor region 60 is referred to as the second intermediate surface $S_{60}$, in resting conditions the first intermediate surface $S_{70}$ is coplanar with the second intermediate surface $S_{60}$. Moreover, the deformable semiconductor region 70 has a smaller thickness than the fixed semiconductor region 60 and delimits a portion of the cavity 30 at the top.

The supporting structure 32 of the first connection structure 22 further comprises a respective conductive region 72, a respective first insulating region 74, and a respective second insulating region 76, which will be referred to in what follows, respectively, as the deformable conductive region 72 and the first and second deformable insulating regions 74, 76.

The first deformable insulating region 74 is made, for example, of thermal oxide and extends over the deformable semiconductor region 70, with which it is in direct contact. Without any loss of generality, the first deformable insulating region 74 has the same thickness as the first fixed insulating region 64.

The deformable conductive region 72 is made, for example, of polysilicon and extends over the first deformable insulating region 74, with which it is in direct contact. Without any loss of generality, the deformable conductive region 72 has the same thickness as the fixed conductive region 62.

The second deformable insulating region 76 is made, for example, of TEOS oxide and extends over the deformable conductive region 72, with which it is in direct contact. Without any loss of generality, the second deformable insulating region 76 has the same thickness as the second fixed insulating region 66.

The supporting structure 32 of the first connection structure 22 further comprises a respective electrode region 78, which will be referred to in what follows as the bottom electrode region 78. In detail, the bottom electrode region 78 is made, for example, of platinum and extends over the second deformable insulating region 76, with which it is in direct contact.

The bottom electrode region 78 is delimited at the top by the aforementioned top surface $S_{32}$. Without any loss of generality, the bottom electrode region 78 has the same thickness as the fixed electrode region 68. Moreover, the bottom electrode region 78 and the fixed electrode region 68 form a single region, i.e., form a single piece; in use, said region can be set to ground, as described hereinafter.

Figure 4:
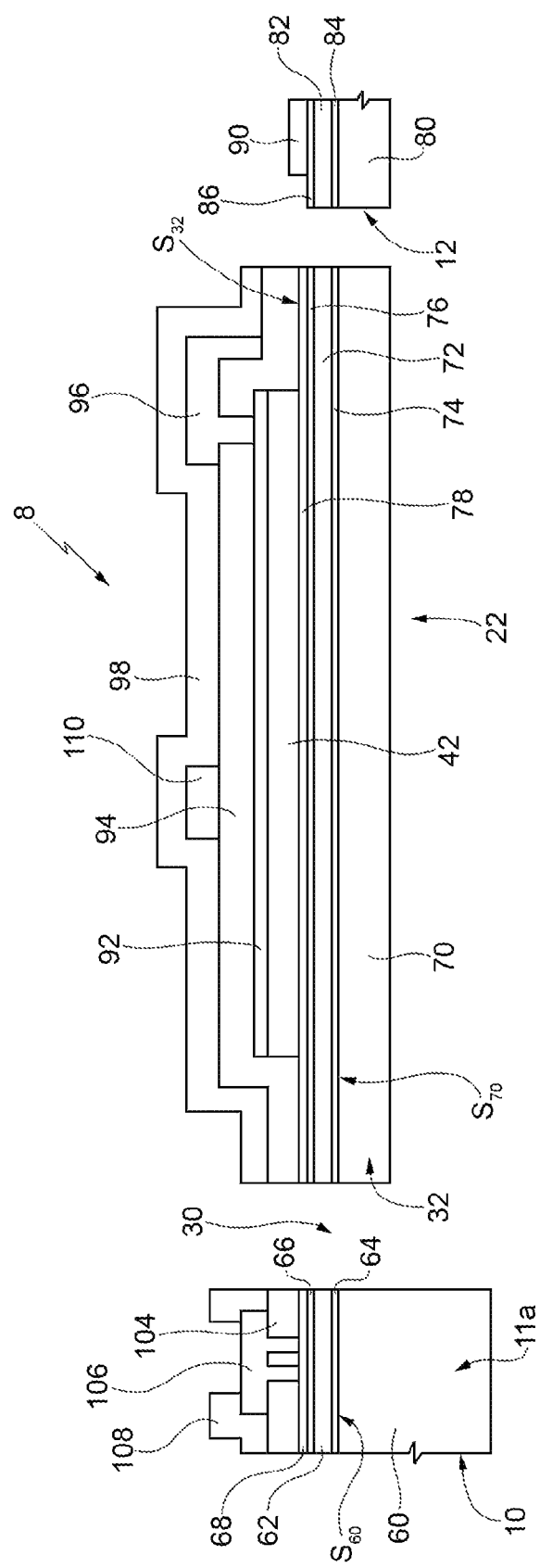
FIGS. 4 and 5 are schematic cross-sectional views (not in scale) of the MEMS reflector, taken respectively along lines of section IV-IV and V-V shown in FIG. 2.

In practice, the main piezoelectric regions 40 and the secondary piezoelectric regions 42 extend over the bottom electrode region 78, with which they are in direct contact. In this connection, purely by way of example, the cross section shown in FIG. 4 is represented so as to show a secondary piezoelectric region 42. Without any loss of generality, in the embodiment shown in FIG. 4, each one of the main piezoelectric regions 40 and the secondary piezoelectric regions 42 extends parallel to the axis x for an extension smaller than the corresponding extension of the underlying portion of bottom electrode region 78, thus leaving a part of the latter exposed.

Extending over each main piezoelectric region 40 and each secondary piezoelectric region 42, in direct contact therewith, is a corresponding metal region 92, made, for example, of an alloy of metal materials. Without any loss of generality, in the embodiment illustrated in FIG. 4, each main piezoelectric region 40 and each secondary piezoelectric region 42 are entirely coated by the corresponding metal regions 92.

The first connection structure 22 further comprises a dielectric region 94, which will be referred to in what follows as the deformable dielectric region 94.

In detail, the deformable dielectric region 94 is made, for example, of silicon oxide, or else silicon nitride, and extends, in direct contact therewith, over the metal regions 92 and the exposed portions of the bottom electrode region 78.

The first connection structure 22 further comprises a first metallization 96, which in part extends on the deformable dielectric region 94 and in part traverses the deformable dielectric region 94 itself, until it comes into contact with the secondary piezoelectric regions 42. The first metallization 96 hence enables electrical connection of the secondary piezoelectric regions 42 to the first d.c. generator 50.

The first connection structure 22 further comprises a second metallization 110, which will be described in detail hereinafter and is arranged on the deformable dielectric region 94. Moreover, the first connection structure 22 comprises a further dielectric region 98, which will be referred to in what follows as the deformable passivation region 98.

In detail, the deformable passivation region 98 is made, for example, of silicon nitride and extends on the deformable dielectric region 94 and the first and second metallizations 96, 110.

Without any loss of generality, it is possible, as shown in FIG. 4, for the fixed structure 10 to comprise moreover a respective dielectric region 104, which will be referred to in what follows as the fixed dielectric region 104. The fixed dielectric region 104 may be made of the same material of which the deformable dielectric region 94 is made and extends on the fixed electrode region 68. In addition, the fixed dielectric region 104 and the deformable dielectric region 94 may form a single overall region; i.e., they may not be physically separate.

The fixed structure 10 further comprises a third metallization 106, which extends through the fixed dielectric region 104, as far as into contact with the fixed electrode region 68. In use, as mentioned previously, the third metallization 106 makes it possible to set to ground the fixed electrode region 68 and the bottom electrode region 78.

In the embodiment shown in FIG. 4, the fixed structure 10 comprises a further dielectric region 108, which will be referred to in what follows as the fixed passivation region 108. The fixed passivation region 108 extends on the fixed dielectric region 104 and the third metallization 106, leaving a portion of the third metallization 106 exposed. The fixed passivation region 108 and the deformable passivation region 98 may form a single region.

Figure 5:
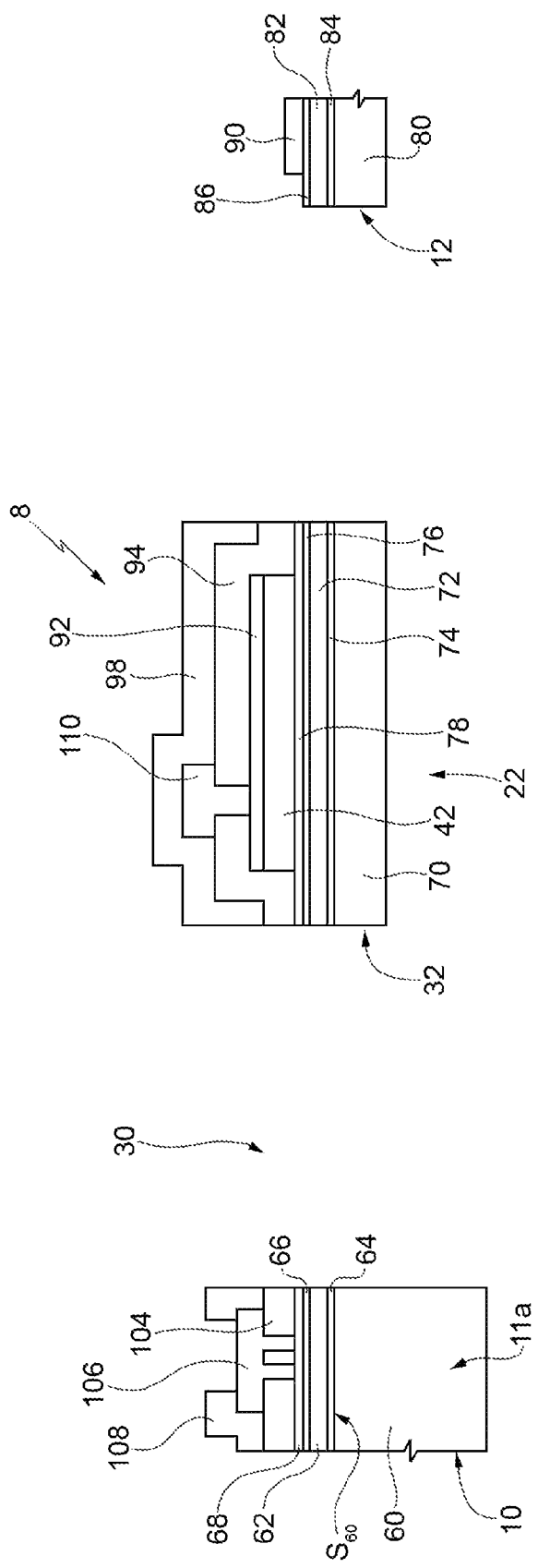

Once again with reference to the second metallization 110, as shown in FIG. 5, in part it extends on the deformable dielectric region 94 and in part it traverses the deformable dielectric region 94 itself until it comes into contact with the main piezoelectric regions 40. The second metallization 110 hence enables electrical connection of the main piezoelectric regions 40 to the first a.c. generator 48.

As regards the mobile structure 12, as shown in FIG. 4, it further comprises a respective semiconductor region 80, a respective conductive region 82, a respective first insulating region 84, and a respective second insulating region 86, which will be referred to in what follows, respectively, as the mobile semiconductor region 80, the mobile conductive region 82 and the first and second mobile insulating regions 84, 86.

The mobile semiconductor region 80, the first mobile insulating region 84, the mobile conductive region 82, and the second mobile insulating region 86 are arranged in succession, stacked on top of one another. Moreover, the mobile semiconductor region 80, the first mobile insulating region 84, the mobile conductive region 82, and the second mobile insulating region 86 may have the same thicknesses as the deformable semiconductor region 70, the first deformable insulating region 74, the deformable conductive region 72, and the second deformable insulating region 76, respectively.

The mobile semiconductor region 80, the fixed semiconductor region 60, and the deformable semiconductor region 70 may form a single semiconductor region.

The first fixed insulating region 64, the first deformable insulating region 74, and the first mobile insulating region 84 may form a single insulating region. Likewise, the second fixed insulating region 66, the second deformable insulating region 76, and the second mobile insulating region 86 may form a single insulating region.

In addition, the fixed conductive region 62, the deformable conductive region 72, and the mobile conductive region 82 may form a single conductive region.

Present on the second mobile insulating region 86 is a mirror 90, which is arranged in direct contact with the second mobile insulating region 86 and is made, for example, of a metal film (for example, an aluminum film).

Once again with reference to the second, third, and fourth connection structures 24, 26, 28, they are fixed to the second, third, and fourth side walls $P_2$, $P_3$, $P_4$, respectively. In addition, in top plan view, the second connection structure 24 is rotated through 90° in a counterclockwise direction with respect to the first connection structure 22 in such a way that its own main body is oriented parallel to the axis x. The third connection structure 26 is rotated through 180° in a counterclockwise direction with respect to the first connection structure 22 in such a way that its own main body is oriented parallel to the axis y. Finally, the fourth connection structure 28 is rotated through 270° in a counterclockwise direction with respect to the first connection structure 22 in such a way that its own main body is oriented parallel to the axis x. Again, the points of fixing of the first, second, third, and fourth connection structures 22, 24, 26, 28 to the mobile structure 12 are arranged substantially at the same distance from an axis of symmetry H of the mobile structure 12 (in resting conditions). These fixing points are moreover spaced at equal angles apart from one another in such a way that adjacent fixing points are angularly spaced apart by 90°.

Figure 6:
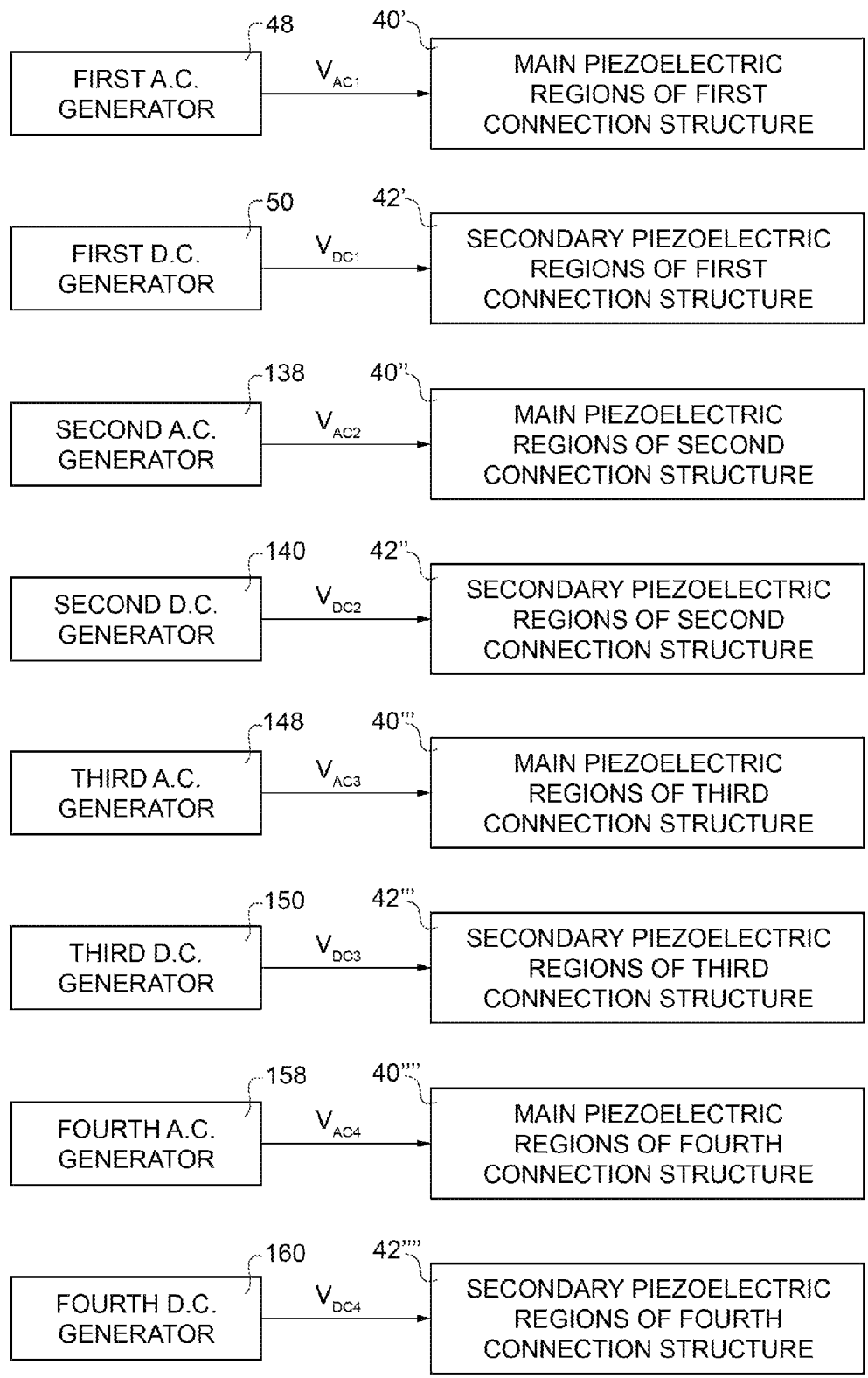
FIG. 6 shows a block diagram that illustrates electrical connections between portions of a MEMS system that includes the MEMS reflector.

As shown in FIG. 6, the MEMS projective system 1 further comprises a second a.c. generator 138, a third a.c. generator 148, and a fourth a.c. generator 158, as well as a second d.c. generator 140, a third d.c. generator 150, and a fourth d.c. generator 160. In FIG. 6, the a.c. voltages generated by the first, second, third, and fourth a.c. generators 48, 138, 148, and 158 are designated, respectively, by $V_{AC1}$, $V_{AC2}$, $V_{AC3}$, and $V_{AC4}$, whereas the d.c. voltages generated by the first, second, third, and fourth d.c. generators 50, 140, 150, and 160 are designated, respectively, by $V_{DC1}$, $V_{DC2}$, $V_{DC3}$, and $V_{DC4}$. Moreover, FIG. 6 shows how the first a.c. generator 48 and the first d.c. generator 50 apply, respectively, the aforementioned voltages $V_{AC1}$ and $V_{DC1}$ to the main piezoelectric regions (here designated by 40') and to the secondary piezoelectric regions (here designated by 42') of the first connection structure 22. The second, third, and fourth a.c. generators 138, 148, 158 apply the aforementioned voltages $V_{AC2}$, $V_{AC3}$, and $V_{AC4}$, respectively, to the main piezoelectric regions (designated, respectively, by 40", 40''', and 40'''') of the second, third, and fourth connection structures 24, 26, 28. The second, third, and fourth d.c. generators 140, 150, 160 apply, respectively, the aforementioned voltages $V_{DC2}$, $V_{DC3}$, and $V_{DC4}$ to the secondary piezoelectric regions (designated, respectively, by 42", 42''', and 42'''') of the second, third, and fourth connection structures 24, 26, 28.

In greater detail, the voltages $V_{AC1}$ and $V_{AC3}$ have one and the same amplitude (for example, approximately 30 V), one and the same frequency $f_1$, and are in phase opposition; i.e., they are phase shifted by 180° with respect to one another. The voltages $V_{AC2}$ and $V_{AC4}$ have a same amplitude, a same frequency $f_2$, and are in phase opposition; i.e., they are phase shifted by 180° with respect to one another.

This being said, the first and third connection structures 22, 26 form a first actuation unit such that, following upon application of the aforementioned voltages $V_{AC1}$ and $V_{AC3}$, this first actuation unit causes an oscillation (about the resting position and with a frequency equal to the aforementioned frequency $f_1$) of the mobile structure 12, about an axis $A_1$, which is inclined by 45° with respect to the axis x and passes, for example, through the centroid of the mobile structure 12. In practice, this oscillation is due to the periodic deformations undergone by the first and third connection structures 22, 26 on account of application of the aforementioned voltages $V_{AC1}$ and $V_{AC3}$.

Figure 7A:
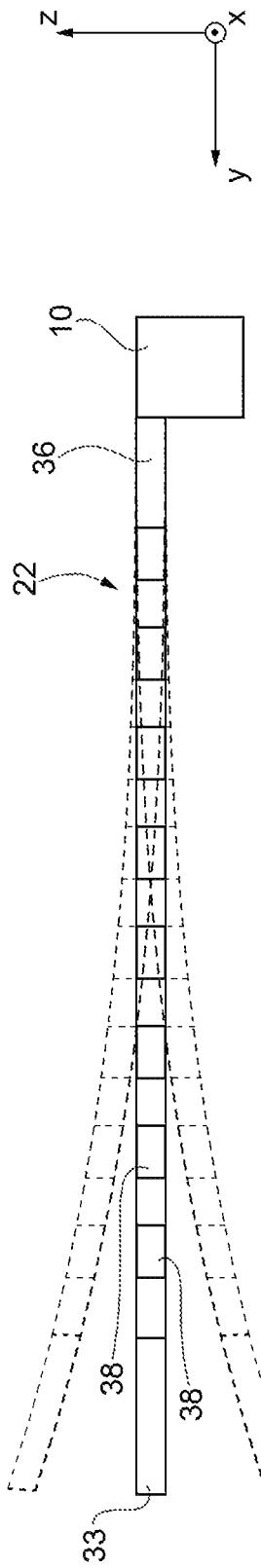
FIG. 7a is a schematic side view of a portion of the MEMS reflector, when subjected to an oscillation.

In greater detail, considering, for example, the main piezoelectric regions 40 of the first connection structure 22, when they are subjected to a voltage that is, for example, positive, they undergo, amongst other things, lengthening in directions parallel to the axes x and y. In other words, there occurs a differential lengthening of each main piezoelectric region 40 with respect to the underlying supporting structure 32, what entails, in a way similar to what occurs in the case of bimetallic strips, bending of the first connection structure 22, with consequent curving of the latter. In particular, the first connection structure 22 bends in such a way that the first portion 33 of the supporting structure 32, fixed to the mobile structure 12, lowers, drawing along with it the part of mobile structure 12 to which it is fixed. Instead, in the case where to the main piezoelectric regions 40 a voltage that is, for example, negative, is applied, the deflection of the first connection structure 22 is such that the first portion 33 of the supporting structure 32 rises. In either case, to a first approximation, the deflection of the first connection structure 22 occurs in a plane parallel to the plane yz, as shown qualitatively in FIG. 7a, where for simplicity possible torsions about the longitudinal axis of the main body 36 are not represented. The hypothetical deformations of the first connection structure 22 shown in FIG. 7a are hence purely qualitative, to provide an explanatory example.

This being said, since the main piezoelectric regions 40 of the first and third connection structures 22, 26 are driven in phase opposition, corresponding to a rise of the first portion 33 of the supporting structure 32 of the first connection structure 22 is a lowering of the corresponding portion of the third connection structure 26, with consequent rotation of the mobile structure 12.

Figure 7B:
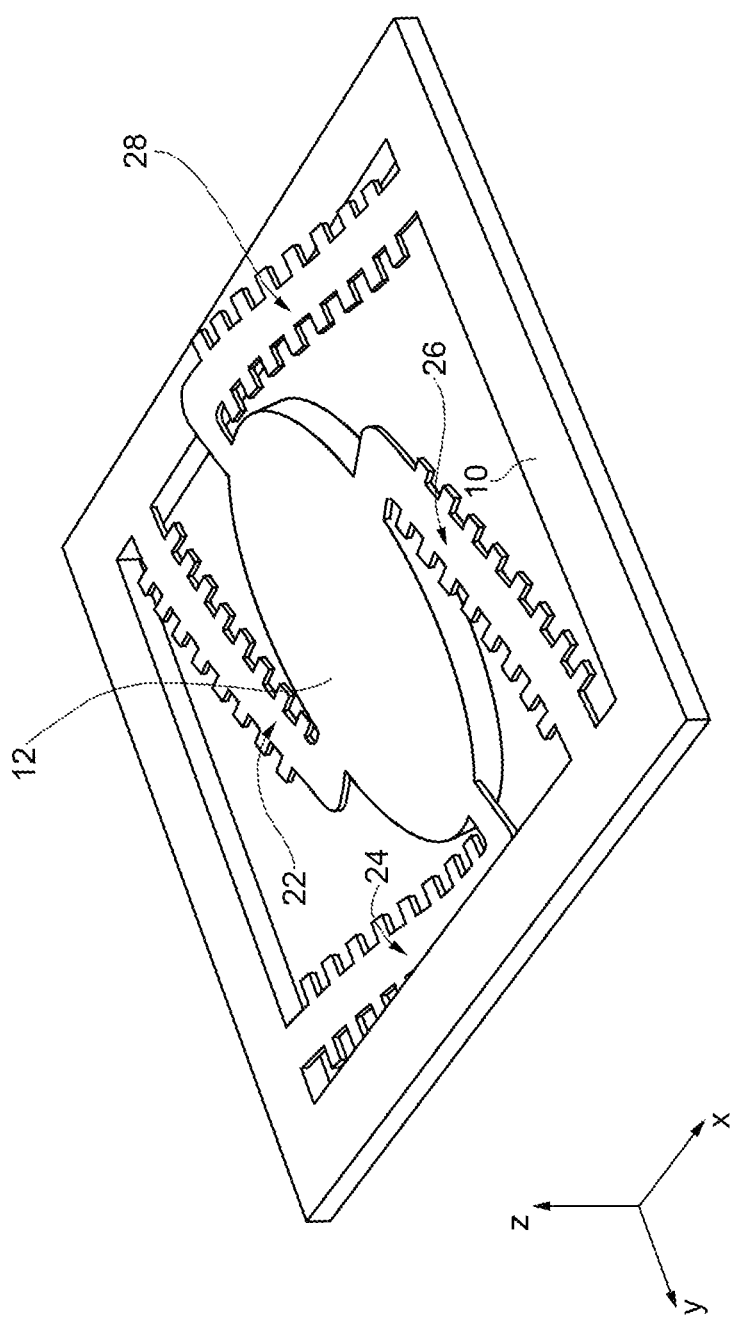
FIG. 7b is a schematic perspective view with portions removed of the MEMS reflector, when subjected to an example of deformation.

For the same reasons, the second and fourth connection structures 24, 28 form a second actuation unit such that, following upon application of the aforementioned voltages $V_{AC2}$ and $V_{AC4}$, this second actuation unit causes an oscillation (about the resting position and with a frequency equal to the aforementioned frequency $f_2$) of the mobile structure 12, about an axis $A_2$ inclined by 45° with respect to the axes x and y and orthogonal to the axis $A_1$. An example of possible deformation to which the MEMS reflector 8 is subjected is shown qualitatively in FIG. 7b.

In greater detail, the aforementioned frequencies $f_1$ and $f_2$ are approximately equal to the resonance frequencies of the mobile structure 12, respectively about the aforementioned axes $A_1$ and $A_2$, in order to convert electrical energy into kinetic energy in an efficient way. In other words, if $f_{r1}$ and $f_{r2}$ are the resonance frequencies of the mobile structure 12 about the aforementioned axes $A_1$ and $A_2$, respectively, we have $f_1 \approx f_{r1}$ and $f_2 \approx f_{r2}$.

In greater detail, the resonance frequencies $f_{r1}$ and $f_{r2}$ depend upon the voltages $V_{DC1}$, $V_{DC2}$, $V_{DC3}$, and $V_{DC4}$. In what follows it is assumed, without any loss of generality, that $V_{DC1} = V_{DC3} = V_{axis1}$ and $V_{DC2} = V_{DC4} = V_{axis2}$.

Once again in greater detail, the MEMS reflector 8 is such that, if $V_{DC1} = V_{DC2} = V_{DC3} = V_{DC4}$, we have $f_{r1} = f_{r2}$, since the MEMS reflector 8 exhibits a symmetry about the axis of symmetry H. This being said, the resonance frequency $f_{r1}$ can be modulated by varying the voltage $V_{axis1}$, whereas the resonance frequency $f_{r2}$ can be modulated by varying the voltage $V_{axis2}$.

In practice, the first, second, third, and fourth connection structures 22, 24, 26, and 28 function as springs. The voltage $V_{axis1}$ modulates the stiffness of the first and third connection structures 22, 26, whereas the voltage $V_{axis2}$ modulates the stiffness of the second and fourth connection structures 24, 28. In particular, with reference, for example, to the first connection structure 22, the voltage $V_{axis1}$ modulates the stiffness of the first connection structure 22 in regard to deformations in the plane yz, i.e., to deformations that cause oscillation of the mobile structure 12 about the axis $A_1$.

Figure 8:
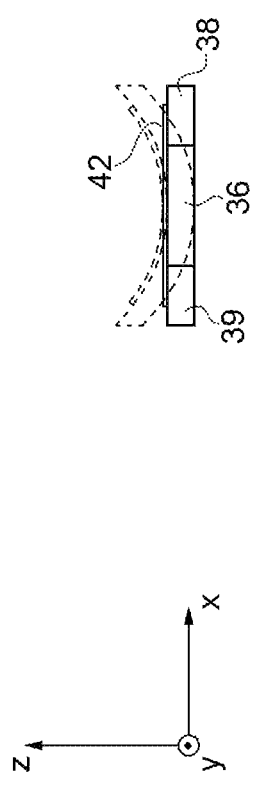
FIG. 8 is a schematic cross-sectional view (not in scale) of a portion of the MEMS reflector, when subjected to bending, this section being taken along the line of section VIII-VIII shown in FIG. 2.

In greater detail, with reference, for example, to the first connection structure 22, in the case where, for example, $V_{axis1}>0$, there occurs (amongst other things) a differential lengthening of each secondary piezoelectric region 42, parallel to the axis x, with respect to the underlying supporting structure 32. This entails a deflection of each secondary piezoelectric region 42 and of the underlying portion of supporting structure 32. In particular, the ends (with respect to a direction parallel to the axis x) of the secondary piezoelectric region 42, that are arranged, respectively, on the corresponding inner transverse element 38 and on the corresponding outer transverse element 39, tend to rise. In other words, each secondary piezoelectric region 42 and the underlying portion of supporting structure 32 bend in a plane parallel to the plane xz. Consequently, each secondary piezoelectric region 42 and the underlying portion of supporting structure 32, and consequently the second portion 34 of the supporting structure 32, tend to assume a U shape, as shown qualitatively in FIG. 8, with consequent variation of the stiffness of the first connection structure 22, as mentioned previously. In this connection, the presence of the inner transverse elements 38 and of the outer transverse elements 39 and the elongated shape of the secondary piezoelectric elements 42 enable variation of the stiffness of the corresponding connection structure in an efficient way, hence with low voltages. In particular, as mentioned previously, the stiffness of the first connection structure 22 in regard to deformations that cause oscillation of the mobile structure 12 about the axis $A_1$ is varied.

To a first approximation, the resonance frequency of each connection structure varies linearly as a function of the voltage applied to its own secondary piezoelectric regions.

This being said, imposing for example $V_{DC1}=V_{DC2}=V_{axis1}\neq V_{axis2}=V_{DC3}=V_{DC4}$, a deviation $\Delta f_r$ between the resonance frequencies $f_{r1}$ and $f_{r2}$ of the MEMS reflector 8 is induced. Moreover, it may be shown that the MEMS reflector 8 enables precise control of deviations $\Delta f_r$ in the region of a few tens of hertz, even when the resonance frequencies $f_{r1}$ and $f_{r2}$ are in the region of 30 kHz.

Figure 9:
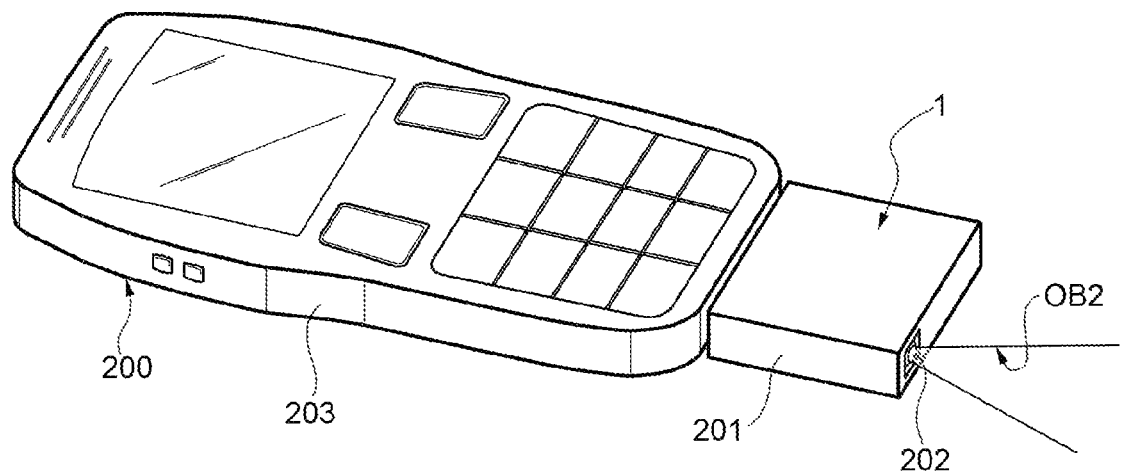
FIGS. 9 and 10 are schematic perspective views of portable apparatuses that incorporate the projective system.

As illustrated in FIG. 9, the MEMS projective system 1 may be provided as separate, stand-alone, accessory with respect to an associated portable electronic apparatus 200, such as, for example, a cellphone or smartphone (or else, for instance, a PDA, a tablet, a digital audio player, or a controller for videogames), being coupled to the portable electronic apparatus 200 itself by means of suitable electrical and mechanical connection elements (not illustrated in detail). In this case, the MEMS projective system 200 is provided with a case 201 of its own, which has at least one portion 202 transparent to the reflected optical beam OB2 generated by the MEMS reflector 8. The case 201 of the MEMS projective system 1 is coupled in a releasable way to a respective case 203 of the portable electronic apparatus 200.

Figure 10:
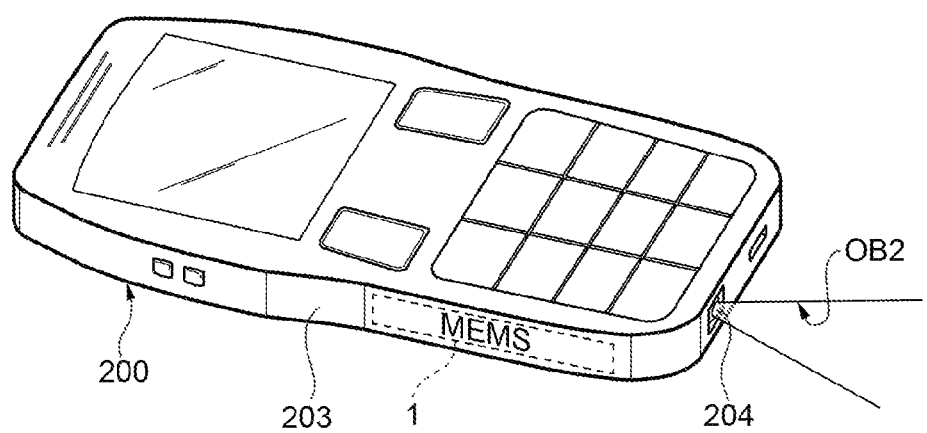

Alternatively, as illustrated in FIG. 10, the MEMS projective system 1 may be integrated within the portable electronic apparatus 200, being arranged in the case 203 of the portable electronic apparatus 200 itself, which has in this case a respective portion 204 transparent to the reflected optical beam OB2 generated by the MEMS reflector 8. In this case, the MEMS system 1 is, for example, coupled to a printed circuit present within the case 203 of the portable electronic apparatus 200.

From what has been described and illustrated previously, the advantages that the present solution affords emerge clearly.

In particular, thanks to the use of an elastic actuation system of a piezoelectric type, the present MEMS device enables implementation of an optical scan along two axes, with high scanning frequencies, which differ from one another by approximately 0.1%. This makes it possible to reduce the flicker phenomenon and to generate high-resolution images. Moreover, the difference in frequency can be modulated electrically in an extremely precise way.

In conclusion, it is clear that modifications and variations may be made to what has been described and illustrated herein, without thereby departing from the sphere of protection of the present invention, as defined in the annexed claims.

For example, the connection structures may have shapes and arrangement different from what has been described previously. For instance, within each connection structure, the number, shape, and arrangement of the main piezoelectric regions 40 and of the secondary piezoelectric regions 42 may be different from what has been described, as likewise the shape of the first and second portions 33, 34 of the supporting structure 32.

More in general, each connection structure may have a composition (understood as shape, number, and type of regions that form it) that is different from the one described. For example, it is possible for the supporting structure 32 to be made up of a different number of regions, or in any case of regions of a type different from the one described. For instance, the deformable semiconductor structure 70 may be absent and/or the shape and arrangement of the first and second metallizations 96, 110 and of the metal region 92 may be different from what has been described. Likewise, also the composition of the fixed structure 10 may be different from what has been described.

The number of the connection structures may be different from what has been described. For example, embodiments are possible that comprise just one connection structure for each actuation unit. For example, it is thus possible for there to be present only the first and second connection structures 22, 24. In addition, irrespective of the number of connection structures, it is possible for them to have a different mutual arrangement. For instance, embodiments (not shown) are possible that include three connection structures.

Finally, the actuation units may be actuated in a different way from what has been described. For example, with reference, without any loss of generality, to the embodiment shown in FIG. 1, it is, for example, possible to have $V_{AC3}=V_{AC4}=0$, in which case, the third and fourth connection structures 26, 28 are not actuated. In this case, it is moreover possible for the third and fourth connection structures 26, 28 to be without the respective main piezoelectric elements. Moreover, it is, for example, possible for the voltages (for example) $V_{AC1}$ and $V_{AC3}$ to be of a unipolar type and such that, when one of them assumes a positive value, the other assumes a zero or negative value.

As regards bending of the secondary piezoelectric elements 42, it can be controlled indifferently with a positive or negative voltage, which can also cause an opposite curving with respect to what has been shown previously. Moreover, it is possible to have $V_{DC1}\neq V_{DC2}$ and/or $V_{DC3}\neq V_{DC4}$.

Finally, embodiments are possible in which the secondary elements 42 are arranged on a subset of the connection structures. For example, an embodiment is possible that includes only the first and second connection structures 22, 24, or in any case in which the third and fourth connection structures 26, 28 are without main piezoelectric elements (and possibly also without the secondary piezoelectric elements), and in which only one between the first and second connection structures 22, 24 comprises the secondary piezoelectric elements 42.

The invention claimed is:

1. A MEMS device, comprising:
   a fixed structure;
   a mobile structure including a reflecting element;
   a first deformable structure arranged between the fixed structure and the mobile structure; and
   a second deformable structure arranged between the fixed structure and the mobile structure;
   wherein each of the first and second deformable structures comprises a respective number of main piezoelectric elements; and
   wherein the main piezoelectric elements of the first deformable structure are configured to be electrically controlled for causing a first substantially periodic deformation of the first deformable structure and a consequent oscillation of the mobile structure about a first axis; and
   wherein the main piezoelectric elements of the second deformable structure are configured to be electrically controlled for causing a second substantially periodic deformation of the second deformable structure and a consequent oscillation of the mobile structure about a second axis; and
   wherein the first deformable structure comprises a respective number of secondary piezoelectric elements configured to be electrically controlled for causing a second deformation of the first deformable structure and vary a first resonance frequency of the mobile structure about said first axis.

2. The device according to claim 1,
   wherein the first deformable structure comprises a respective supporting structure that is attached to the fixed structure and to the mobile structure; and
   wherein the main piezoelectric elements and the secondary piezoelectric elements of the first deformable structure are mechanically coupled to said respective supporting structure.

3. The device according to claim 2, wherein the supporting structure of the first deformable structure has a respective main body that has an elongated shape along a respective direction of elongation.

4. The device according to claim 3, wherein the main piezoelectric elements of the first deformable structure are arranged in the direction of elongation of said respective main body.

5. The device according to claim 4, wherein the main piezoelectric elements and the secondary piezoelectric elements of the first deformable structure are interspersed with one another in said direction of elongation of said respective main body.

6. The device according to claim 3, wherein the secondary piezoelectric elements of the first deformable structure have elongated shapes in a direction transverse to the direction of elongation of said main body.

7. The device according to claim 6,
   wherein said supporting structure forms a plurality of first transverse elements which extend from a first side of said main body and a plurality of second transverse elements which extend from a second side of said main body, said first and second sides being opposite to one another; and
   wherein each secondary piezoelectric element is mechanically coupled to a corresponding pair formed by one of said first transverse elements and one of said second transverse elements in such a way that, during said second deformation of the first deformable structure, the transverse elements of said pair curve.

8. The device according to claim 3, wherein the supporting structure has an L shape; and wherein a long arm of said L shape is formed by said main body.

9. The device according to claim 1,
   wherein said fixed structure is made at least in part of semiconductor material; and
   wherein each one of the first and second deformable structures comprises a respective bottom electrode region; and
   wherein the main piezoelectric elements and the secondary piezoelectric elements of the first deformable structure extend on top of the bottom electrode region of the first deformable structure; and
   wherein the main piezoelectric elements of the second deformable structure extend on top of the bottom electrode region of the second deformable structure.

10. The device according to claim 9, wherein each one of the first and second deformable structures comprises a respective semiconductor region.

11. The device according to claim 1, wherein the second deformable structure comprises a respective number of secondary piezoelectric elements configured to be electrically controlled for causing a second deformation of the second deformable structure and vary a second resonance frequency of the mobile structure about said second axis.

12. The device according to claim 11, wherein the second deformable structure has a same configuration as the first deformable structure but is rotated with respect to the first deformable structure.

13. The device according to claim 11,
   wherein the second deformable structure comprises a respective supporting structure attached to the fixed structure and to the mobile structure; and
   wherein the main piezoelectric elements and the secondary piezoelectric elements of the second deformable structure are mechanically coupled to the respective supporting structure.

14. The device according to claim 13,
   wherein the supporting structure of the second deformable structure has a respective main body which has a shape elongated in a respective direction of elongation; and
   wherein the secondary piezoelectric elements of the second deformable structure have elongated shapes transverse to the direction of elongation of the main body of the second deformable structure.

15. The device according to claim 1, further comprising:
   a third deformable structure and a fourth deformable structure, each of which is arranged between the fixed structure and the mobile structure and each of which comprises a number of respective main piezoelectric elements and a number of respective secondary piezoelectric elements; and
   wherein the main piezoelectric elements of the third deformable structure are configured to be electrically controlled for causing a third substantially periodic deformation of the third deformable structure and said oscillation of the mobile structure about said first axis; and
   wherein the main piezoelectric elements of the fourth deformable structure are configured to be electrically controlled for causing a fourth substantially periodic deformation of the fourth deformable structure and said oscillation of the mobile structure about said second axis; and wherein the secondary piezoelectric elements of the third deformable structure are configured to be electrically controlled for causing a second deformation of the third deformable structure and vary said first resonance frequency; and wherein the secondary piezoelectric elements of the fourth deformable structure are configured to be electrically controlled for causing a second deformation of the fourth deformable structure and vary said second resonance frequency.

16. A MEMS projector system, comprising:
a MEMS device comprising:
a fixed structure;
a mobile structure including a reflecting element;
a first deformable structure arranged between the fixed structure and the mobile structure; and
a second deformable structure arranged between the fixed structure and the mobile structure;
wherein each of the first and second deformable structures comprises a respective number of main piezoelectric elements; and
wherein the main piezoelectric elements of the first deformable structure are configured to be electrically controlled for causing a first substantially periodic deformation of the first deformable structure and a consequent oscillation of the mobile structure about a first axis; and
wherein the main piezoelectric elements of the second deformable structure are configured to be electrically controlled for causing a second substantially periodic deformation of the second deformable structure and a consequent oscillation of the mobile structure about a second axis; and
wherein the first deformable structure comprises a respective number of secondary piezoelectric elements configured to be electrically controlled for causing a second deformation of the first deformable structure and vary a first resonance frequency of the mobile structure about said first axis;
a first a.c. generator configured to apply a first a.c. voltage to the main piezoelectric elements of the first deformable structure;
a second a.c. generator configured to apply a second a.c. voltage to the main piezoelectric elements of the second deformable structure, the second a.c. voltage having a frequency different from a frequency of the first a.c. voltage; and
at least one first d.c. generator configured to apply a first d.c. voltage to the secondary piezoelectric elements of the first deformable structure.

17. The MEMS projector system of claim 16 further comprising an optical source configured to generate an optical beam that impinges upon the reflecting element.

18. The MEMS projector system of claim 16 configured in a portable electronic apparatus.

19. The MEMS projector system of claim 18, wherein a component containing the MEMS device and is a stand-alone accessory having a case releasably coupled to a respective case of said portable electronic apparatus.

20. The MEMS projector system of claim 18, formed in an integrated way within a case of said portable electronic apparatus.

21. The MEMS projector system of claim 18, wherein the portable electronic apparatus is selected from the group consisting of: a cellphone; a smartphone; a PDA; a tablet; a digital audio player; and a controller for videogames.

22. A MEMS device, comprising:
a fixed structure;
a mobile structure with a reflecting element coupled to the fixed structure through at least a first deformable structure and a second deformable structure;
a respective number of main piezoelectric elements mounted to each of the first and second deformable structures, said main piezoelectric elements configured to be electrically controlled for causing oscillations of the mobile structure about a first axis and a second axis, respectively; and
a respective number of secondary piezoelectric elements mounted to the first deformable structure, said secondary piezoelectric elements mounted to the first deformable structure configured to be controlled so as to vary a first resonance frequency of the mobile structure about the first axis.

23. The MEMS device of claim 22, wherein said secondary piezoelectric elements are further mounted to the second deformable structure, said secondary piezoelectric elements mounted to the second deformable structure configured to be controlled so as to vary a second resonance frequency of the mobile structure about the second axis.

24. The MEMS device of claim 22, wherein the first deformable structure includes an elongated body and wherein the main piezoelectric elements and the secondary piezoelectric elements are interspersed with one another in a direction of elongation of said elongated body.

25. The MEMS device of claim 24, further including:
a plurality of first transverse elements which extend from a first side of said elongated body and a plurality of second transverse elements which extend from a second side of said elongated body, said first and second sides being opposite to one another; and
wherein each secondary piezoelectric element is mechanically coupled to a corresponding pair formed by one of said first transverse elements and one of said second transverse elements.

26. The MEMS device of claim 25, wherein the secondary piezoelectric elements have elongated shapes which extend in a direction transverse to the direction of elongation of said main body.

27. The MEMS device of claim 22, wherein the first deformable structure includes an elongated body and wherein the main piezoelectric elements comprise a plurality of main piezoelectric elements arranged along a direction of elongation of said elongated body and separated from each other.

* * * * *